United States Patent
Dougherty

(10) Patent No.: US 8,007,989 B1
(45) Date of Patent: Aug. 30, 2011

(54) METHOD AND SOLUTION FOR FORMING A PATTERNED FERROELECTRIC LAYER ON A SUBSTRATE

(75) Inventor: Thomas Kirk Dougherty, Playa Del Rey, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 803 days.

(21) Appl. No.: 12/081,143

(22) Filed: Apr. 11, 2008

(51) Int. Cl.
*G03F 7/00* (2006.01)
*G03F 1/00* (2006.01)

(52) U.S. Cl. .................. 430/322; 430/325; 430/330

(58) Field of Classification Search .................. 430/322, 430/325, 330
See application file for complete search history.

(56) References Cited

U.S. PATENT DOCUMENTS

| | | | |
|---|---|---|---|
| 5,021,398 A * | 6/1991 | Sharma et al. ................ 505/413 |
| 5,443,746 A | 8/1995 | Harris | |
| 5,667,621 A | 9/1997 | Dougherty | |
| 6,197,102 B1 | 3/2001 | Sawada | |
| 6,528,172 B2 | 3/2003 | Sawada ......................... 428/470 |
| 6,558,463 B2 | 5/2003 | Hase | |
| 6,679,996 B1 | 1/2004 | Yao ................................. 216/40 |

\* cited by examiner

*Primary Examiner* — Cynthia Kelly
*Assistant Examiner* — Connie P Johnson
(74) *Attorney, Agent, or Firm* — John Tarlano

(57) ABSTRACT

A method for forming a patterned ferroelectric layer, having ferroelectric electronic properties, on a substrate. A composite layer, made of ferroelectric layer producing metal acrylate compounds, a photoinitiator compound and an acrylate crosslinking compound is formed on the substrate. A photomask is formed on the composite layer. Unmasked areas of the composite layer are irradiated with ultraviolet light. A solvent removes non-irradiated areas of the composite layer from the substrate. The patterned composite layer is heated in an oxygen atmosphere to cause a chemical reaction among the ferroelectric layer producing metal acrylate compounds and oxygen, a patterned ferroelectric layer being formed on the substrate.

3 Claims, 2 Drawing Sheets

METHOD AND SOLUTION FOR FORMING A PATTERNED FERROELECTRIC LAYER ON A SUBSTRATE

U.S. Pat. No. 6,679,996 describes a method of patterning a metal oxide layer by application of a photoresist layer on the metal oxide layer. The photoresist layer is applied to the metal oxide layer, and the photo resist layer is patterned. Then the metal oxide layer is patterned. Then the patterned photoresist layer is removed from the patterned metal oxide layer.

In the presently disclosed method, a patterned ferroelectric layer is formed on a substrate from a composite layer. The composite layer is formed on the substrate. The composite layer is formed from a disclosed solution. The composite layer is patterned and then oxidized.

The disclosed solution has compounds that produces a composite layer. The composite layer can be both patterned and oxidized, to form a patterned ferroelectric layer. The composite layer is formed on the substrate from the unique solution. The solution contains metal acrylate compounds, a photoinitiator compound, an acrylate crosslinking compound, an emollient and a solvent. The photoinitiator compound causes the crosslinking compound to polymerize the acrylate compounds when the photoinitator compound is energized by ultraviolet light. The metal acrylate compounds are polymerized in selected areas of the composite layer by shining the ultraviolet light through a photomask. The non-irradiated areas of the composite layer are removed from the substrate to form a patterned composite layer. The metal acrylate compounds in the patterned composite layer are made to react chemically among themselves and with oxygen, in an oxygen atmosphere, at high temperature. Patterned ferroelectric regions of a patterned ferroelectric layer are formed on the substrate.

The solution is placed on the substrate in drop form. The substrate could be a silicon wafer. The solution is dried by evaporating the solvent, to form a first film on the substrate. More solution is placed on the substrate and dried, to form a second film on the first film. These steps are repeated until a soft layer, that has a desired thickness of a composite layer is formed on the substrate. The composite layer can, alternately, be a single film.

A photo mask is placed on the composite layer. An ultraviolet light is shone on the photomask. Ultra violet light irradiates portions of the composite layer that are below transparent areas of the photomask. Ultra violet light-irradiated areas of the composite layer are hardened by the ultraviolet light. The ultraviolet light activates the photoinitiator in the irradiated areas of the composite layer. The activated photoinitiator initiates polymerization of the acrylate compounds by the crosslinking compound, in irradiated areas of the composite layer. The polymerization causes the irradiated areas of the composite layer to become hard.

Soft acrylate areas of the composite layer are removed from the substrate, by immersing the substrate and irradiated composite layer into a solvent. The soft areas of the composite layer are removed from the substrate by the solvent. The hardened areas of the composite layer are not removed from the substrate by the solvent. A patterned composite layer is produced on the substrate. The patterned composite layer contains metal acrylate compounds.

As previously stated, the substrate, having an irradiated composite layer on it, is placed into a chemical bath that holds a solvent. The soft acrylate areas of the composite layer are removed from the substrate by the solvent in the bath. A patterned composite layer, having metal acrylate compounds in the patterned composite layer, is formed on the substrate The substrate, having the patterned composite layer on the substrate, is placed in a high temperature oxygen-containing oven. The metal acrylate compounds, within the patterned composite layer, chemically react in the oven, with each other and with the oxygen. A patterned ferroelectric layer is produced on the substrate. The patterned ferroelectric layer can be a part of electronic devices.

SUMMARY OF THE INVENTION

A method for forming a patterned ferroelectric layer on a substrate, comprising depositing a composite layer on a substrate, the composite containing metal acrylate compounds, a photoinitiator compound, an acrylate crosslinking compound and a solvent, placing a photomask onto the soft layer, the photomask having areas that are transparent to ultraviolet light, irradiating the composite layer, through the photomask, with ultraviolet light, placing a solvent on the irradiated layer to remove non-irradiated areas of the composite layer from the substrate, a patterned composite layer being formed on the substrate, and heating the patterned composite layer in an oxygen atmosphere to cause a chemical reaction among the metal acrylate compounds and oxygen.

DESCRIPTION OF THE PREFERRED EMBODIMENT

Figure 1:
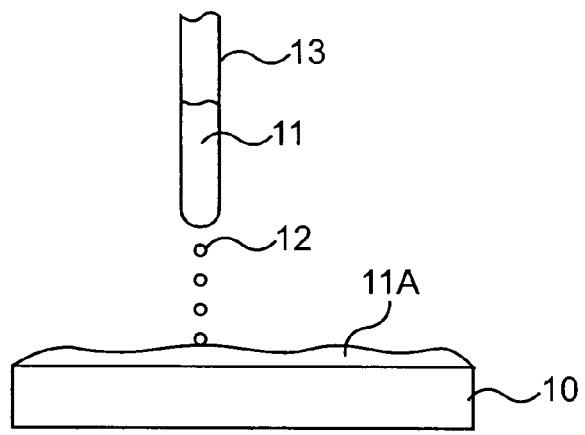
FIG. 1 is a sectional view of a step of depositing a solution on a substrate.
Figure 2:
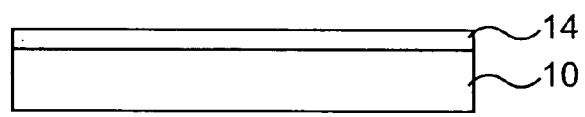
FIG. 2 is a sectional view of a first film of a composite layer that is located on the substrate of FIG. 1.

A substrate 10 is shown in FIG. 1. Drops of a solution 11, including drop 12, are deposited on the substrate 10 from a dropper 13. A deposited solution 11A is formed on substrate 10. The deposited solution 11A is composed of a solvent, metal acrylate compounds, an acrylate crosslinking compound and a photoinitiator compound. The solvent in the deposited solution 11A is evaporated by low temperature heating the deposited solution 11a and the substrate 10. Such a low temperature is 100 degrees Fahrenheit. A film 14 is formed on the substrate 10 due to the evaporation, as shown in FIG. 2. The film 14 is photo-sensitive to ultraviolet light.

As shown in FIG. 2, the dried film 14 is formed on the substrate 10 from the deposited solution 11A. The dried film 14 contains the metal acrylate compounds, the acrylate crossing-linking compound and the photoinitiator compound. The solvent in the deposited solution 11A has been evaporated, to form the film 14 on the substrate 10.

Figure 3:
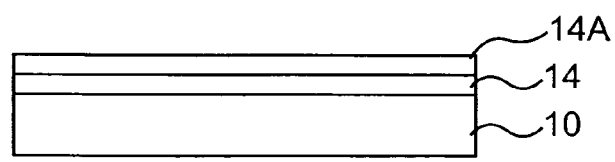
FIG. 3 is a sectional view of a second film of a composite layer, the second film being located on the first film of FIG. 2.

Other drops of the solution 11 are deposited on the film 14 from dropper 13. A deposited solution is formed on film 14. The solvent in the deposited solution is evaporated, to form a film 14A on the film 14, as shown in FIG. 3.

Figure 4:
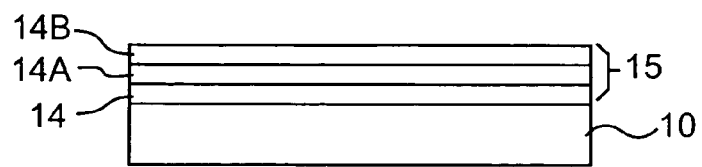
FIG. 4 is a sectional view of a third film of a composite layer, the third film being located on the second film of FIG. 3.

The above combination of steps of depositing a solution and evaporating a solvent from the solution is repeated several times. A composite layer 15, that contains several stacked films, namely films 14, 14A and 14B, is formed on the substrate 10. The composite layer 15 is shown in FIG. 4. The composite layer 15 is formed from successive aliquot amounts of the solution 11. These aliquot amounts of the solution are deposited onto the substrate 10. The composite layer 15 is formed from several films that are similar to film 14. The composite layer 15 contains metal acrylate compounds, an acrylate crosslinking compound and a photoinitiator compound. The composite layer 15 is formed on substrate 10, as shown in FIG. 4. A composite layer can be made from only a single film.

Figure 5:
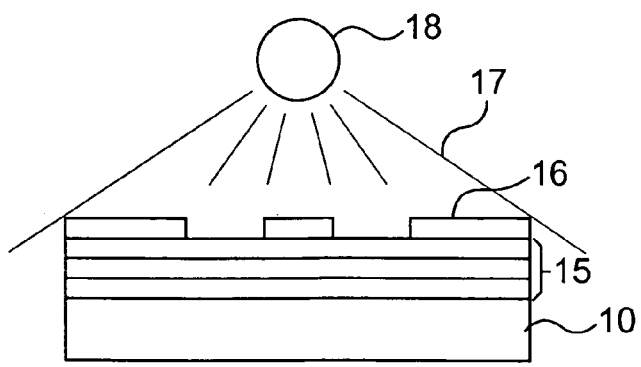
FIG. 5 is a sectional view of a photomask that is located on the composite layer of FIG. 4, plus a sectional view of an ultraviolet light source that is shining ultraviolet light through the photomask and onto the composite layer, to form an irradiated composite layer.

A photomask 16 is placed on the composite layer 15, as shown in FIG. 5. The photo-mask 16 has a deign of areas that are transparent to ultraviolet light and other areas that are opaque to ultraviolet light. The photomask 16 are irradiated by ultraviolet light 17 from an ultraviolet lamp 18. The ultraviolet light 17 passes through the transparent areas of the photomask 16. The ultraviolet light 17, that passes through the transparent areas, irradiates areas of the layer 15 that are next to the transparent areas of photomask 16. The ultraviolet light 17 illuminates these latter areas of layer 15. The irradiated areas of composite layer 15 are hardened by the ultraviolet light 17.

Figure 6:
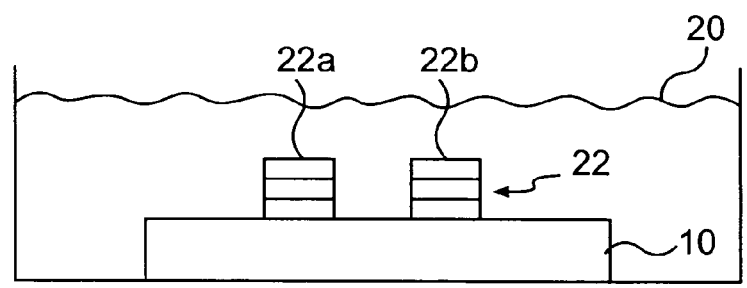
FIG. 6 is a sectional view of the substrate and patterned composite layer immersed in a bath of solvent, a patterned composite layer being formed by action of the solvent on the irradiated composite layer of FIG. 5.

The substrate 10 and irradiated composite layer 15 are placed in a solvent 20, as shown in FIG. 6. A suitable solvent is metheoxyethoxy alcohol. The solvent 20 removes non-irradiated areas, that is, non-irradiated portions, of the irradiated composite layer 15. That is, the solvent 20 removes portions of the irradiated composite layer 15 that had not exposed to ultraviolet light 17 from ultraviolet lamp 18. As shown in FIG. 6, the solvent 20 forms a patterned composite layer 22 on substrate 10. The patterned composite layer 22 has regions 22a and 22c. Regions 22a and 22b of patterned composite layer 22 contain metal acrylate compounds.

Figure 7:
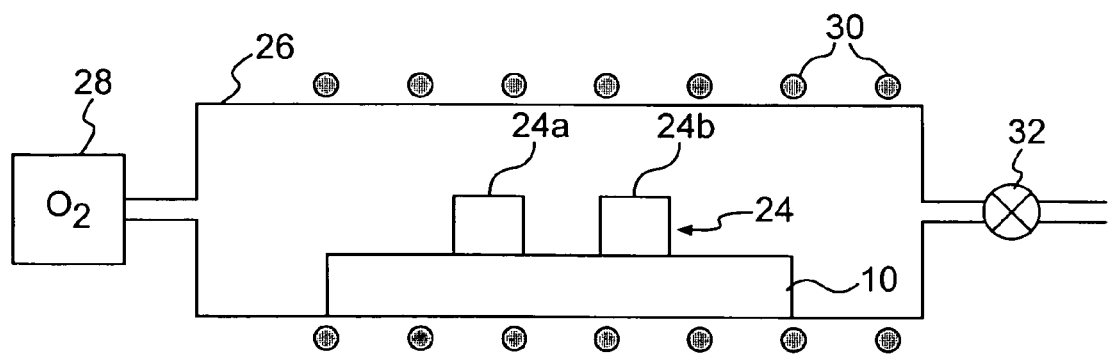
FIG. 7 is a sectional view of ferroelectric regions of a patterned ferroelectric layer, the patterned ferroelectric layer being on the substrate of FIG. 1, the substrate and patterned ferroelectric layer being located in an oxidation furnace.

As shown in FIG. 7, the substrate 10 and patterned composite layer 22 are placed in a quartz oxidation furnace 26. The oxidation furnace 26 has an atmosphere that has an 90 percent concentration of oxygen. The oxygen in quartz oxidation furnace 26 comes from an oxygen tank 28 that is connected to quartz oxidation furnace 26. A internal temperature within the furnace is raised to 800 degrees Celsius by means of heating coils 30 that are located around quartz oxidation furnace 26. Reactive chemicals are driven out of the regions 22a and 22b, by heat, in the quartz oxidation furnace 26. The reactive chemical pass through one-way valve 32 that is connected to quartz furnace 26. Metal atoms, of the metal acrylate compounds within regions 22a and 22b, react chemically with each other and with the oxygen in the quartz oxidation furnace 26, to produce ferroelectric regions 24a and 24b on substrate 10, as shown in FIG. 7. $Bi_2Ta_2SrO_9$, $Bi_2O$, $Ta_2O$ and SrO. are in ferroelectric regions 24a and 24b. The patterned ferroelectric layer 24 contains $Bi_2Ta_2SrO_9$, $Bi_2O$, $Ta_2O$ and SrO. The ferroelectric regions 24a and 24b are parts of patterned ferroelectric layer 24. The patterned ferroelectric layer 24 is located on substrate 10.

The solution 11, that is used in producing the ferroelectric regions 24a and 24b of patterned ferroelectric layer 24, has the following constituents: bismuth methacrylate, strontium methacrylate, tantalum dimethacrylate, benzildimethylketal, triethylenglycol dimethacrylate, glyceryl tri-2-ethylhexanoate, and methoxyethoxy alcohol. The benzildimethylketal is a photoinitiator compound that is suitable for acrylate functionality. The triethylenglycol dimethacrylate is an acrylate crosslinking compound. The glyceryl tri-2-ethyhexanoate is an emollient. The metheoxyethoxy alcohol is a solvent.

The bismuth methacrylate, strontium methacrylate and tantalum methacrylate type metal acrylate compounds are polymerized by the triethylenglycol dimethacrylate, a type acrylate crosslinking compound, after the benzildimethylketal, a type photoinitiator compound, is activated by ultraviolet light.

The metal acrylate compounds in solution 11 react together and with oxygen, in the high temperature oxygen atmosphere of oxidation furnace 26, to form $Bi_2Ta_2SrO_9$, $Bi_2O$, $Ta_2O$ and SrO. The $Bi_2Ta_2SrO_9$, $Bi_2O$, $Ta_2O$ and SrO are in the patterned ferroelectric layer 24.

A solution for use with the present method comprises metal acrylate compounds, a photoinitiator compound, an acrylate crosslinking compound and a solvent.

While the present invention has been disclosed in connection with the preferred embodiment thereof, it should be understood that there are other embodiments which fall within the spirit and scope of the invention as defined by the following claims.

What is claimed is:

1. A method for forming a patterned ferroelectric layer on a substrate, comprising:
   (a) forming a composite layer on a substrate, the composite layer comprising bismuth methacrylate, strontium methacrylate and tantalum dimethacrylate metal acrylate compounds, a photoinitiator compound and an acrylate crosslinking compound;
   (b) placing a photomask onto the composite layer, the photomask having areas that are transparent to ultraviolet light;
   (c) irradiating the composite layer, through the photomask, with ultraviolet light;
   (d) placing a solvent on the irradiated composite layer to remove non-irradiated areas of the composite layer from the substrate, a patterned composite layer being formed on the substrate; and
   (e) heating the patterned composite layer in an oxygen atmosphere to cause a chemical reaction among the bismuth methacrylate, strontium methacrylate and tantalum dimethacrylate metal acrylate compounds and oxygen, a patterned ferroelectric layer being formed on the substrate.

2. A method for forming a patterned ferroelectric layer on a substrate, comprising:
   (a) depositing a solution onto a substrate, the solution comprising bismuth methacrylate, strontium methacrylate and tantalum dimethacrylate metal acrylate compounds, a photoinitiator compound, an acrylate crosslinking compound and a solvent;
   (b) heating the solution and the substrate, to drive solvent from the deposited solution, a composite layer being formed on the substrate;
   (c) placing a photomask onto the composite layer, the photomask having areas that are transparent to ultraviolet light;

(d) irradiating the composite layer, through the photomask, with ultraviolet light;

(e) placing a solvent on the irradiated composite layer to remove non-irradiated areas of the composite layer from the substrate, a patterned composite layer being formed on the substrate; and (f) heating the patterned composite layer in an oxygen atmosphere to cause a chemical reaction among the bismuth methacrylate, strontium methacrylate and tantalum dimethacrylate metal acrylate compounds and oxygen, a patterned ferroelectric layer being formed on the substrate.

3. A method for forming a patterned ferroelectric layer on a substrate, comprising:

(a) depositing a solution onto a substrate, the solution comprising bismuth methacrylate, strontium methacrylate, tantalum dimethacrylate, benzildimethylketal, triethylenglycol dimethacrylate, glyceryl tri-2-ethylhexanoate, and methoxyethoxy alcohol;

(b) heating the solution and the substrate, to drive solvent from the deposited solution, a composite layer being formed on the substrate;

(c) placing a photomask onto the composite layer, the photomask having areas that are transparent to ultraviolet light;

(d) irradiating the composite layer, through the photomask, with ultraviolet light;

(e) placing a solvent on the irradiated composite layer to remove non-irradiated areas of the composite layer from the substrate, a patterned composite layer being formed on the substrate; and (f) heating the patterned composite layer in an oxygen atmosphere to cause a chemical reaction among the bismuth methacrylate, strontium methacrylate, tantalum dimethacrylate and oxygen, a patterned ferroelectric layer being formed on the substrate.

* * * * *